United States Patent
Chen et al.

(10) Patent No.: US 7,342,808 B2
(45) Date of Patent: Mar. 11, 2008

(54) FIXING MECHANISM FOR PRINTED CIRCUIT BOARD

(75) Inventors: Yun-Lung Chen, Tu-Cheng (TW); Zhao-Yang Tang, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 394 days.

(21) Appl. No.: 11/019,799

(22) Filed: Dec. 21, 2004

(65) Prior Publication Data

US 2005/0185388 A1    Aug. 25, 2005

(30) Foreign Application Priority Data

Feb. 20, 2004    (TW) .............................. 93202442 U

(51) Int. Cl.
*H05K 7/18* (2006.01)

(52) U.S. Cl. ....................... 361/801; 361/759

(58) Field of Classification Search ................. 361/726, 361/732, 740, 747, 759, 801, 807–81; 174/138 D, 174/138 E; 312/216
See application file for complete search history.

(56) References Cited

U.S. PATENT DOCUMENTS 6,385,051 B1 *  5/2002  Perez et al. .................. 361/759
6,470,555 B2   10/2002  Boe
6,580,617 B2 *  6/2003  Kao ........................... 361/759

FOREIGN PATENT DOCUMENTS

CN      00201452.1     12/2000
TW      84201628        7/1995

* cited by examiner

*Primary Examiner*—Tuan T. Dinh
*Assistant Examiner*—Abiy Getachew
(74) *Attorney, Agent, or Firm*—Morris Manning Martin LLP; Tim Tingkang Xia, Esq.

(57) ABSTRACT

A fixing mechanism includes a chassis (400) with a plurality of fasteners (450) formed therein. A tray (100) is movably disposed in the chassis for supporting a printed circuit board (PCB) (10) which defines a plurality of apertures (13). The fasteners are relatively sliding in the apertures of the PCB respectively. The tray includes misaligned first and second driven portions (116, 138) at an end. A driving piece (200) is rotatably fixed in the chassis adjacent the end of the tray. The driving piece is generally positioned between the first and second driven portions of the tray initially, and the driving piece is rotated in a vertical plane to selectively drive the first and second driven portions to move the tray in a horizontal plane such that the fasteners clasp or unclasp the PCB.

18 Claims, 6 Drawing Sheets

FIXING MECHANISM FOR PRINTED CIRCUIT BOARD

BACKGROUND OF THE INVENTION

1. Field of the Invention

The present invention relates to a fixing mechanism for a printed circuit board, and more particularly to a fixing mechanism which facilitates attachment and/or detachment of a printed circuit board in a computer.

2. Description of the Related Art

A conventional method of installing a printed circuit board, such as a motherboard, in a computer is to simply screw the printed circuit board to bosses or other mounting structures suitably mounted on a chassis. However, this printed circuit board installation method substantially increases the time, and thus the cost, required to construct the computer in addition to adding to the complexity and difficulty of assembling, and later disassembling and servicing the computer.

A relatively recent improvement in mounting of a printed circuit board in a computer has introduced a tray structure to support the printed circuit board for easily and quickly assembling and/or disassembling the computer. As illustrated and described in Taiwan Application No. 84201628, a tray is detachably attached to a chassis, and a spring means is provided to facilitate attachment and detachment of the tray. However, the spring means is prone to be useless after repeated use due to impairment of elasticity.

SUMMARY OF THE INVENTION

Accordingly, an object of the present invention is to provide a fixing mechanism which facilitates attachment and/or detachment of a printed circuit board in a computer.

Another object of the present invention is to provide a durable fixing mechanism.

To achieve the above objects, a fixing mechanism in accordance with the present invention comprises a chassis with a plurality of fasteners formed therein. A tray is movably disposed in the chassis for supporting a printed circuit board (PCB) which defines a plurality of apertures. The fasteners are relatively sliding in the apertures of the PCB respectively. The tray comprises misaligned first and second driven portions at an end. A driving piece is rotatably fixed in the chassis adjacent the end of the tray. The driving piece is generally positioned between the first and second driven portions of the tray initially, and the driving piece is rotated in a vertical plane to selectively drive the first and second driven portions to move the tray in a horizontal plane such that the fasteners clasp or unclasp the PCB.

Other objects, advantages and novel features of the present invention will be drawn from the following detailed description of a preferred embodiment of the present invention with the attached drawings, in which:

DETAILED DESCRIPTION OF THE PRESENT INVENTION

Figure 1:
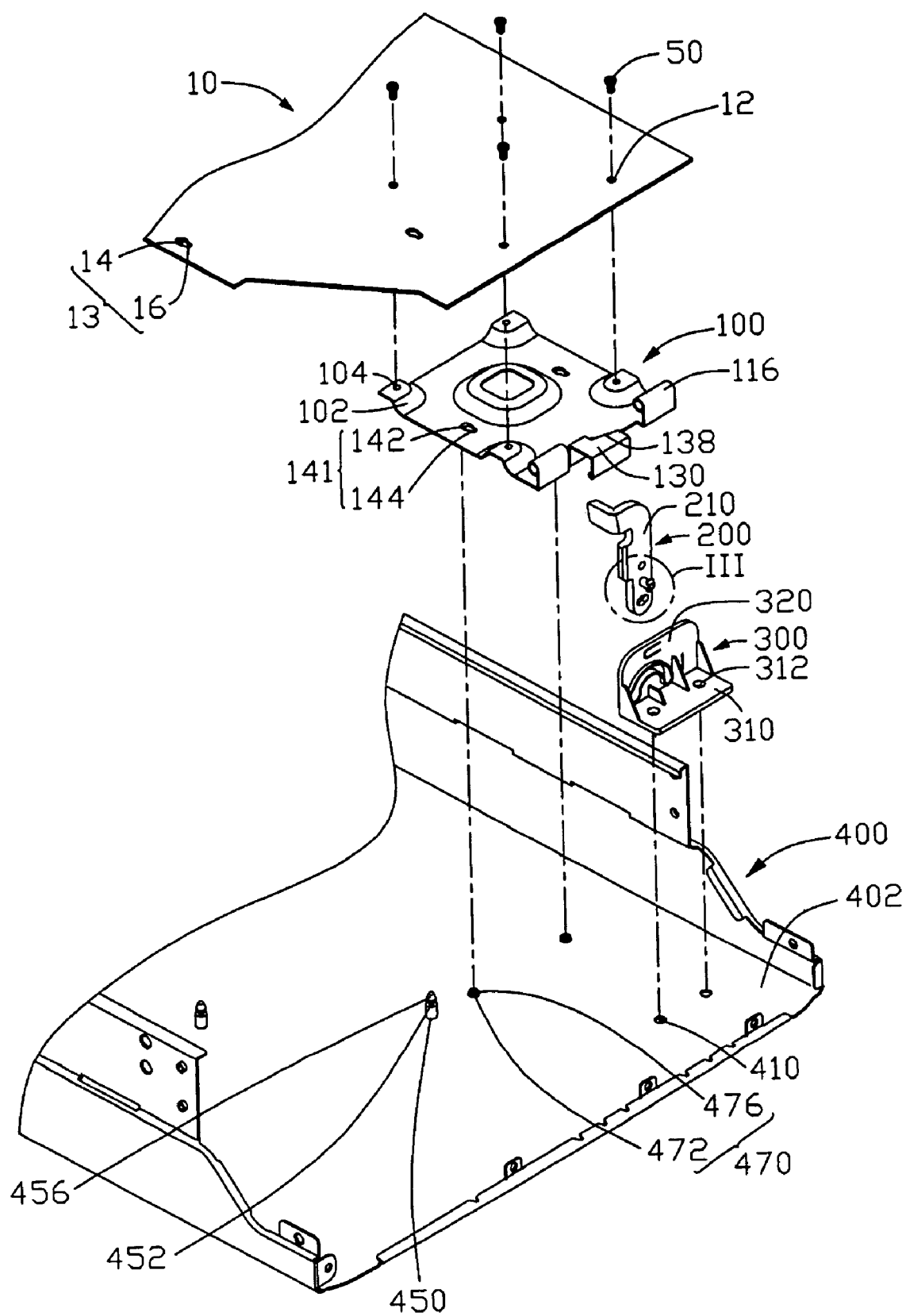
FIG. 1 is an exploded, isometric view of a fixing mechanism and a printed circuit board in accordance with a preferred embodiment of the present invention, the fixing mechanism comprising a tray, a driving piece, a bracket, and a chassis.
Figure 2:
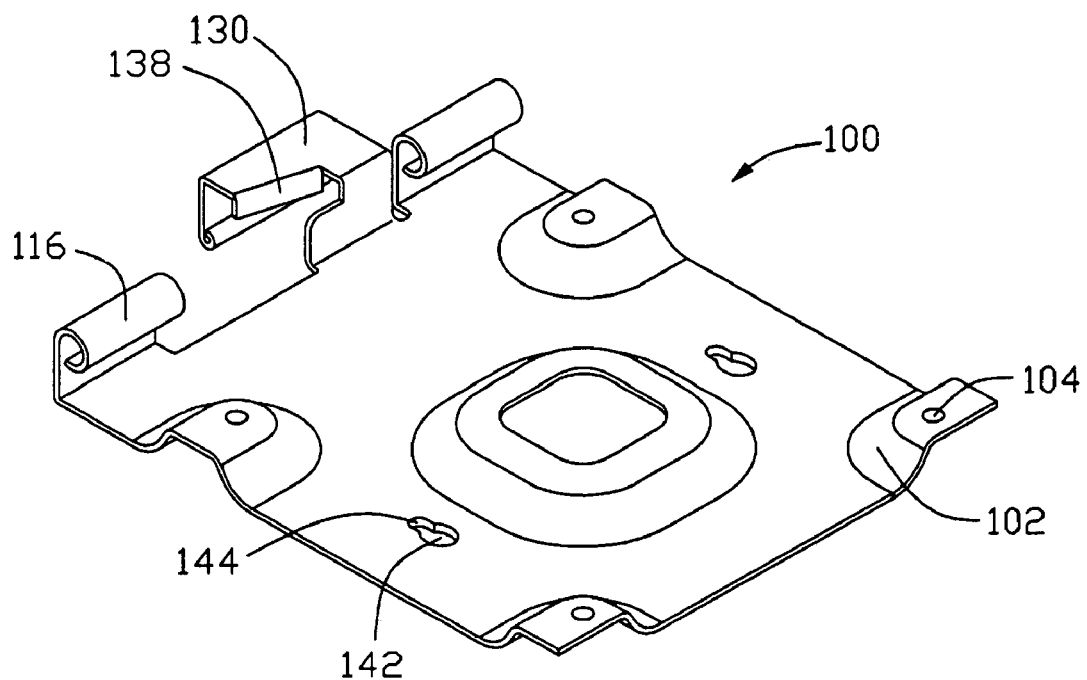
FIG. 2 is an enlarged isometric view of the tray of FIG. 1, but viewed from anther aspect.

Referring to FIGS. 1 and 2, a fixing mechanism for a printed circuit board (PCB) in accordance with a preferred embodiment of the present invention comprises a tray 100 for supporting a PCB 10, a driving piece 200, a bracket 300 supporting the driving piece 200, and a chassis 400 of an electronic device like a computer.

The PCB 10 defines four holes 12, and a plurality of first apertures 13 each comprising an entrance portion 14 and a holding portion 16 in communication with the entrance portion 14.

The tray 100 forms four protrusions 102, each protrusion 102 defining a screw hole 104. Four screws 50 are provided for attaching the PCB 10 to the tray 100 via the holes 12 and the screw holes 104 respectively. A pair of spaced second apertures 141 is defined in the tray 100, each second aperture 141 comprising an entrance portion 142 and a holding portion 144 in communication with the entrance portion 142. A first bent plate is perpendicularly bent from an end of the tray 100 to form a first driven portion 116, and the bent plate has a wrapped free end. A second bent plate 130 is spaced apart from the first driven portion 116, and comprises a first portion bent perpendicularly upwardly from the end of the tray 100, a second portion extended horizontally outwardly from a top edge of the first portion, and a third portion bent downward from a distal edge of the second portion. A second driven portion 138 is bent downward from the second portion of the second bent plate 130 adjacent the end of the tray 100, and the second driven portion 138 is shaped as an oblique tab.

Figure 3:
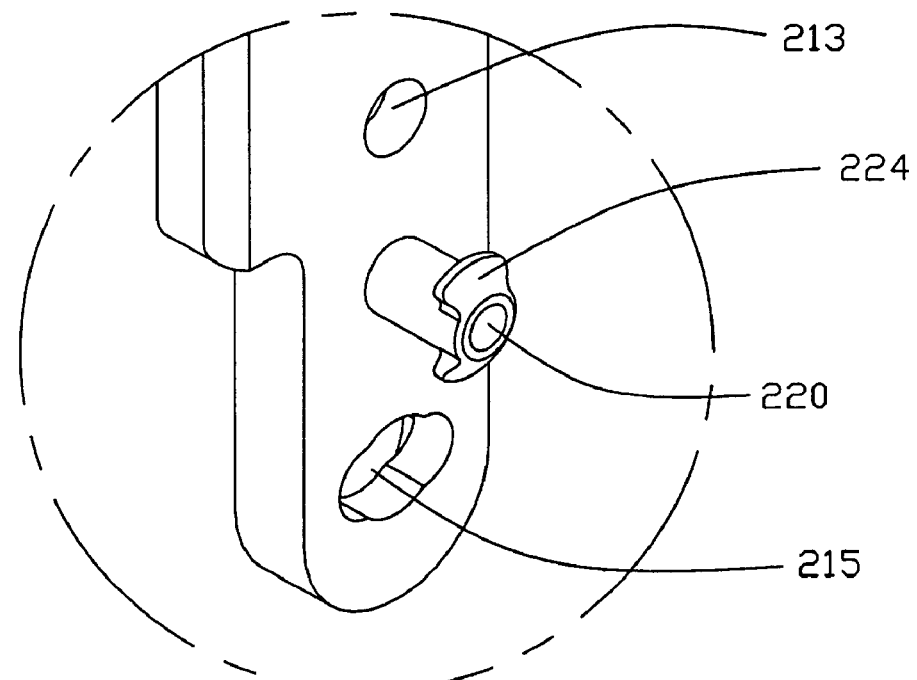
FIG. 3 is an enlarged view of a circled portion III of FIG. 1.
Figure 4:
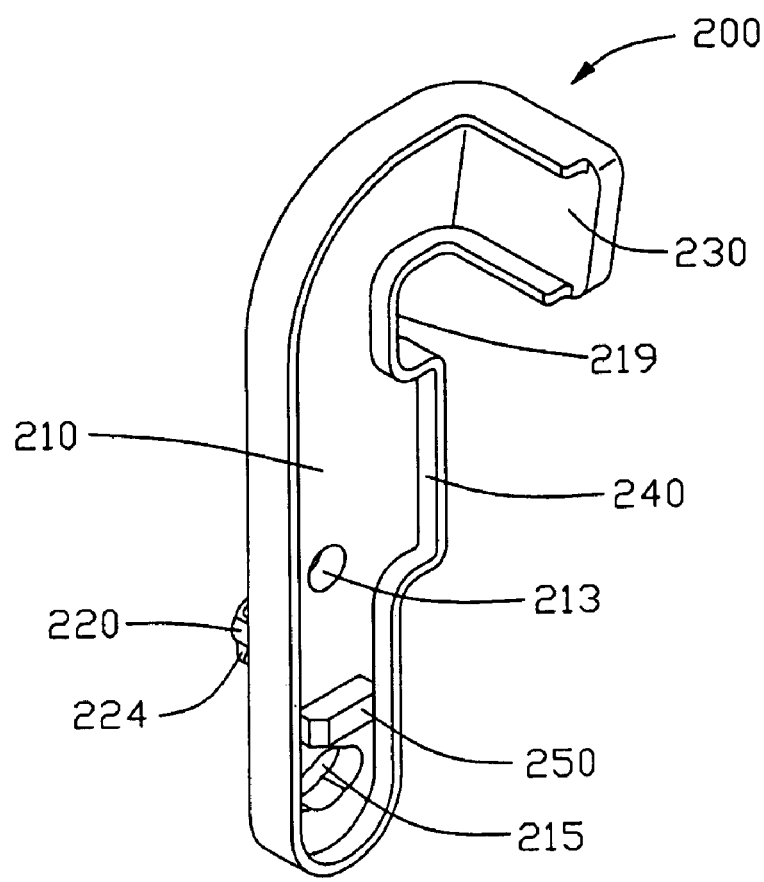
FIG. 4 is an enlarged isometric view of the driving piece of FIG. 1, but viewed from another aspect.

Referring to FIGS. 3 and 4, the driving piece 200 comprises a main body 210 and a knob 230 integrally bent from the main body 210. A retaining hole 213 is defined in a middle portion of the main body 210. A pivot 220 is protruded outwardly from an outer surface of the main body 210 below the retaining hole 213. Two opposite skirts 224 are formed at a free end of the pivot 220. A pivot hole 215 is defined in the main body 210 near a free end thereof. A first driving portion 250 is formed on an inner surface of the main body 210 just above the pivot hole 215, corresponding to the first driven portion 116 of the tray 100. The first driving portion 250 comprises a protrusion. A surrounding rim 219 is bent inwardly from an inner edge of the driving piece 200 with two ends thereof ending at the knob 230. A second driving portion 240 is shaped as a portion of the rim 219 connected to a protruding portion of the edge of the main body 210 adjacent the knob 230, corresponding to the second driven portion 138 of the tray 100.

Figure 5:
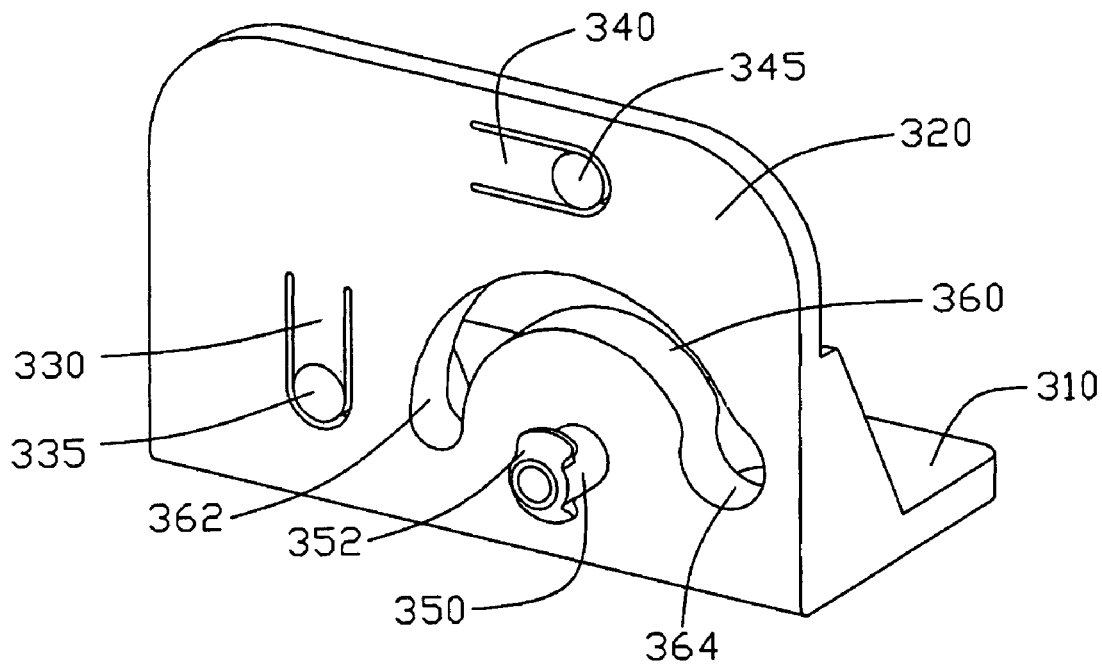
FIG. 5 is an enlarged isometric view of the bracket of FIG. 1, but viewed from another aspect.

Referring to FIGS. 1 and 5, the bracket 300 comprises a horizontal plate 310 and an integral vertical plate 320. Two holes 312 are defined in the horizontal plate 310. An arcuate guideway 360 is defined in the vertical plate 320, corresponding to the pivot 220 of the driving piece 200. The guideway 360 comprises an enlarged first end 364 for entry of the pivot 220 of the driving piece 200, and a second end 362. A pivot 350 is formed below the guideway 360. Two opposite skirts 352 are extended from a free end of the pivot 350. Orthogonal first and second spring fingers 330, 340 are formed in the vertical plate 320 adjacent the guideway 360. First and second convexes 335, 345 are formed on free ends of the first and second spring fingers 330, 340 respectively, for snapping in the retaining hole 213 of the driving piece 200.

Referring to FIG. 1, the chassis 400 comprises a panel 402. Two screw holes 410 are defined in the panel 402, corresponding to the holes 312 of the bracket 300. A plurality of first fasteners 450 are formed on the panel 402, corresponding to the first apertures 13 of the tray 100. Each first fastener 450 comprises a head portion 456 corresponding to the entrance portion 14 of a corresponding first aperture 13, and a neck portion 452 corresponding to the holding portion 16 of the corresponding first aperture 13. Two second fasteners 470 are disposed on the panel 402, corresponding to the second apertures 141 of the tray 100. Each second fastener 470 comprises a head portion 476 corresponding to the entrance portion 142 of a corresponding second aperture 141, and a neck portion 472 corresponding to the holding portion 144 of the corresponding second aperture 13.

Figure 6:
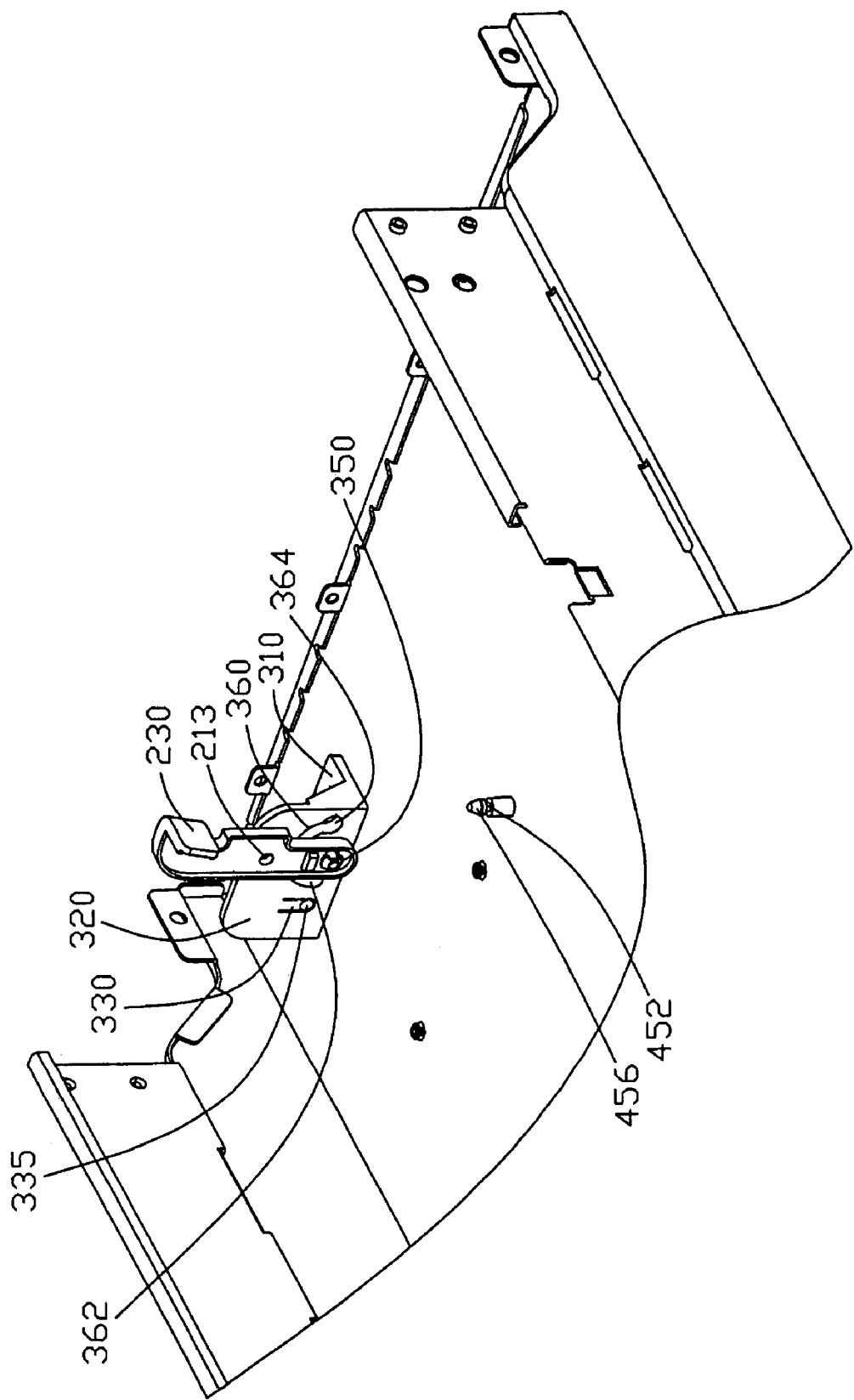
FIG. 6 is a partially assembled view of the fixing mechanism of FIG. 1 with the tray omitted, but viewed from another aspect.
Figure 7:
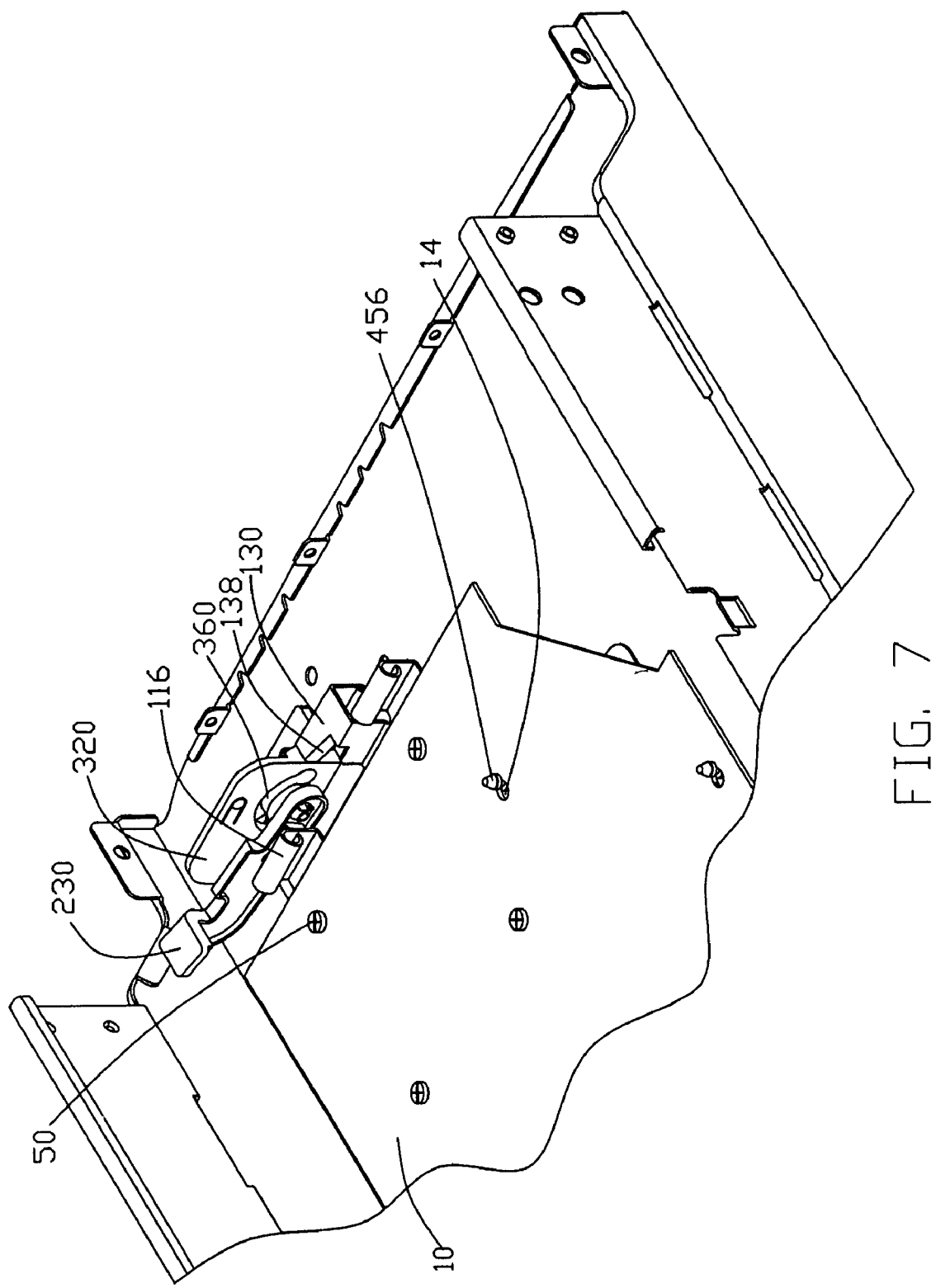
FIG. 7 is an assembled view of FIG. 1 showing the printed circuit board is fixed in the chassis, but viewed from another aspect.
Figure 8:
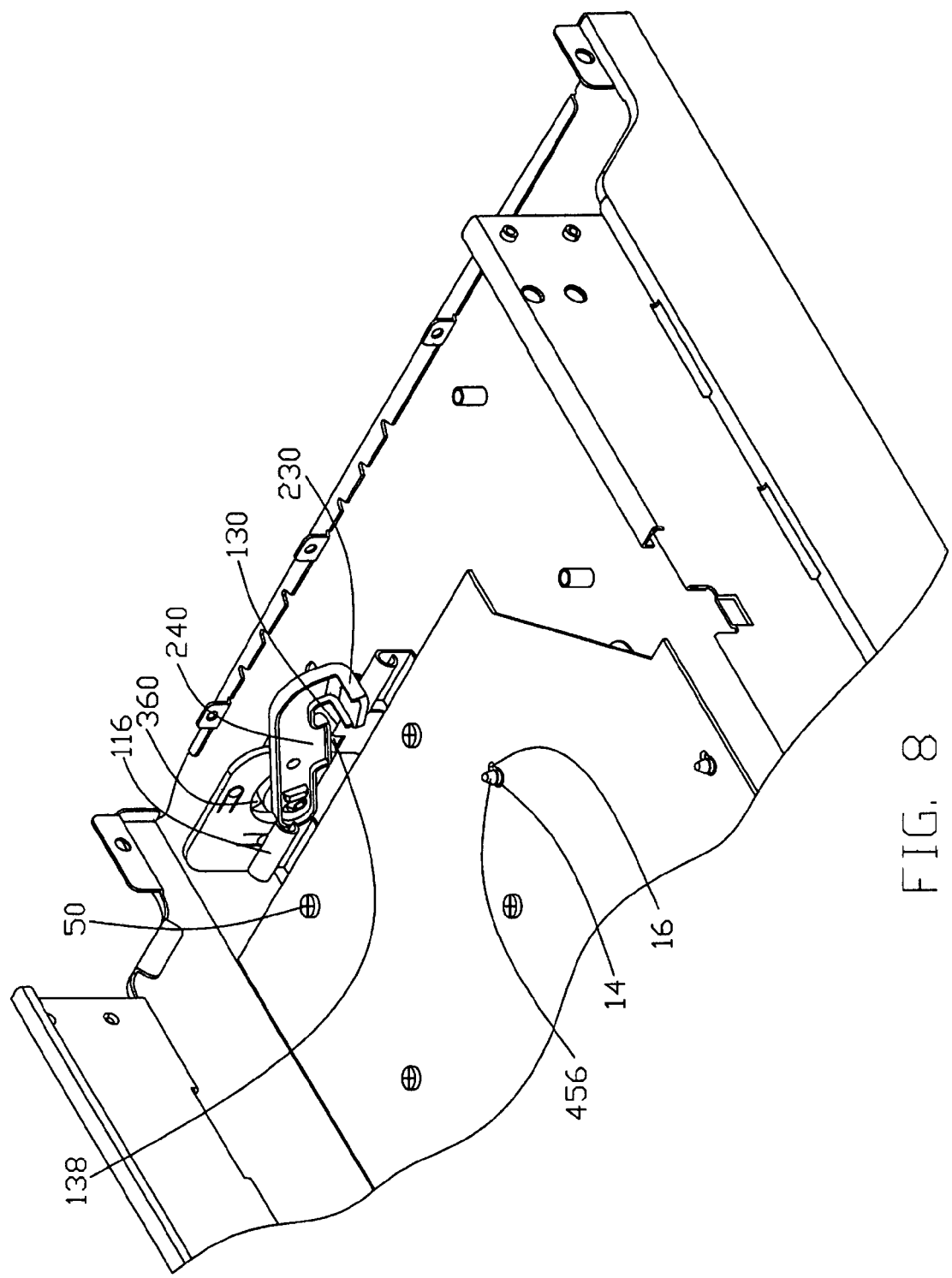
FIG. 8 is similar to FIG. 7, but showing the printed circuit board is ready to be released from the chassis.

In assembly, the bracket 300 is attached to the panel 402 of the chassis 400 with screws (not shown). The driving piece 200 is pivotally attached to the bracket 300, with the pivot 350 of the bracket 300 received in the pivot hole 215 of the driving piece 200 and the pivot 220 of the driving piece 200 received in the guideway 360 of the bracket 300 via the first end 364. Referring to FIG. 6, the driving piece 200 is held generally perpendicular to the panel 402 by means of the second convex 345 of the second spring finger 340 of the bracket 300 snappedly engaged in the retaining hole 213 of the driving piece 200.

The tray 100 is disposed in the chassis 400. The second fasteners 470 are relatively extended through the second apertures 141 of the tray 100 via entrance portions 142 respectively. The driving piece 200 is generally located between the first and second driven portions 116, 138 of the tray 100. The PCB 10 is fastened to the tray 100 with screws 50, and the first fasteners 450 of the chassis 400 are received in the entrance portions 14 of the first apertures 13 of the PCB 10 respectively.

In use, the driving piece 200 is rotated along the guideway 360 of the bracket 300 toward the first driven portion 116 of the tray 100. The driving piece 200 enters between the vertical plate 320 of the bracket 300 and the first driven portion 116, and the first driving portion 250 urges the tray 100 at the first driven portion 116 to move toward interior of the chassis 400. The neck portions 452, 472 of the first and second fasteners 450, 470 are relatively slid from corresponding entrance portions 14, 142 to corresponding holding portions 16, 144 of the first and second apertures 13, 141 respectively. The combined tray 100 and PCB 10 is finally fixed in the chassis 400 with the first and second fasteners 450, 470 respectively clasping the PCB 10 and the tray 100 at the holding portions 16, 144 of the first and second apertures 13, 144. The driving piece 200 is retained to the vertical plate 320 by means of the first convex 335 of the first spring finger 330 snapping in the retaining hole 213 of the driving piece 200.

To detach the PCB 10 from the chassis 400, the driving piece 200 is reversely rotated toward the second driven portion 138 of the tray 100 by the knob 230. The second driving portion 240 of the driving piece 200 contacts and pushes the second driven portion 138 of the tray 100 outwardly. The combined tray$_c$ 100 and PCB 10 is thereby moved outwardly until the neck portions 452, 472 of the first and second fasteners 450, 470 are relatively slid from the corresponding holding portions 16, 144 to the corresponding entrance portions 14, 142 of the first and second apertures 13, 141 respectively. The combined tray 100 and PCB 10 can then be detached from the chassis 400.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A fixing mechanism for a printed circuit board (PCB) defining a plurality of apertures, comprising:
   a chassis comprising a plurality of fasteners for relatively sliding in the apertures of the PCB respectively;
   a tray movably disposed in the chassis for supporting the PCB, the tray comprising first and second driven portions at an end; and
   a driving piece rotatably fixed in the chassis adjacent the end of the tray;
   wherein the driving piece is generally positioned between the first and second driven portions of the tray initially, and the driving piece is rotated in a vertical plane to selectively drive one of the first and second driven portions to move the tray in a corresponding one of a first direction perpendicular to the vertical plane and a second direction opposite to the first direction such that the fasteners clasp or unclasp the PCB.

2. The fixing mechanism as claimed in claim 1, wherein the first driven portion of the tray comprises a bent plate bent perpendicularly from the end, and the second driven portion of the tray comprises an oblique tab spaced from the bent plate and the end of the tray.

3. The fixing mechanism as claimed in claim 1, wherein the driving piece comprises first and second driving portions corresponding to the first and second driven portions of the tray respectively.

4. The fixing mechanism as claimed in claim 3, wherein the first driving portion comprises a protrusion formed on an inner surface of the driving piece, and the second driving portion is formed at a protruding portion of an edge of the driving piece.

5. The fixing mechanism as claimed in claim 4, further comprising a bracket fixed in the chassis, the bracket comprising a vertical plate.

6. The fixing mechanism as claimed in claim 5, wherein a pivot is formed on the vertical plate of the bracket, and a pivot hole is defined in a distal end of the driving piece to pivotally engage the pivot of the bracket.

7. The fixing mechanism as claimed in claim 6, wherein an arcuate guideway is defined in the vertical plate of the bracket, and a pivot is formed on an outer surface of the driving piece to be received in the guideway of the bracket.

8. The fixing mechanism as claimed in claim 7, wherein a pair of orthogonal spring fingers are formed in the vertical plate of the bracket, each of the spring fingers comprises a convex formed on a free end, and a retaining hole is defined in the driving piece to selectively engage the convexes of the spring fingers.

9. A fixing mechanism for a printed circuit board (PCB), comprising:
   a chassis comprising a plurality of fasteners;

a tray movably disposed in the chassis for supporting the PCB, the tray comprising a first driven portion at an end and a second driven portion cantilevered away from the end, a plurality of apertures defined in the tray receiving the fasteners of the chassis; and a driving piece rotatably fixed in the chassis adjacent the end of the tray;

wherein the driving piece is rotated in a vertical plane generally parallel to an edge of the end of the tray to selectively drive one of the first and second driven portions to move the tray in a corresponding one of a first direction perpendicular to the vertical plane and a second direction opposite to the first direction such that the fasteners clasp or unclasp the PCB.

10. The fixing mechanism as claimed in claim 9, wherein spaced first and second bent plates are formed from an edge of the end of the tray, the first bent plate is bent perpendicularly upwardly to form the first driven portion, and an oblique tab depends from the second bent plate extended outwardly to form the second driven portion.

11. The fixing mechanism as claimed in claim 9, further comprising a bracket, the driving piece pivotally attached to the bracket.

12. The fixing mechanism as claimed in claim 9, wherein each of the fasteners comprises a head portion and a neck portion, each of the apertures comprises an entrance portion corresponding to the head portion of a corresponding fastener, and a holding portion corresponding to the neck portion of the corresponding fastener.

13. The fixing mechanism as claimed in claim 9, wherein the second driven portion is shaped as an oblique tab.

14. A fixing mechanism for mounting a printed circuit board (PCB) to a chassis of an electronic device, comprising:

a tray securely attached to said PCB and movable together with said PCB, said tray comprising a first driven portion and a second driven portion spaced from each other at a side of said tray; and a driving piece rotatably attachable to said chassis adjacent to said side of said tray, said driving piece located between said first and second driven portions, and movable between a first position where said driving piece is engaged with said first driven portion to drive said tray and said PCB to a securely fixed position relative to said chassis and a second position where said driving piece is engaged with said second driven portion to drive said tray and said PCB to a removable position away from said chassis.

15. The fixing mechanism as claimed in claim 14, wherein said driving piece is rotatable in a predetermined plane perpendicular to said PCB in said fixed position.

16. The fixing mechanism as claimed in claim 14, further comprising a bracket fixed to said chassis and used to guide rotation of said driving piece.

17. The fixing mechanism as claimed in claim 14, wherein said second driven portion extends away from said side of said tray so as to have said first and second driven portions located at two opposing sides of said driving piece when said driving piece is located in one of said first and second positions.

18. The fixing mechanism as claimed in claim 14, wherein said driving piece comprises a first side to engage with said first driven portion and a second side opposite to said first side to engage with said second driven portion.

* * * * *